(12) United States Patent
Pjencak et al.

(10) Patent No.: US 10,971,632 B2
(45) Date of Patent: Apr. 6, 2021

(54) HIGH VOLTAGE DIODE ON SOI SUBSTRATE WITH TRENCH-MODIFIED CURRENT PATH

(71) Applicant: SEMICONDUCTOR COMPONENTS INDUSTRIES, LLC, Phoenix, AZ (US)

(72) Inventors: Jaroslav Pjencak, Dolni Becva (CZ); Moshe Agam, Portland, OR (US); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/450,298

(22) Filed: Jun. 24, 2019

(65) Prior Publication Data

US 2020/0403103 A1 Dec. 24, 2020

(51) Int. Cl.
*H01L 29/86* (2006.01)
*H01L 29/06* (2006.01)
*H01L 29/78* (2006.01)
*H01L 29/861* (2006.01)
*H01L 21/762* (2006.01)
*H01L 29/66* (2006.01)
*H01L 29/40* (2006.01)

(52) U.S. Cl.
CPC ...... *H01L 29/861* (2013.01); *H01L 21/76289* (2013.01); *H01L 21/76291* (2013.01); *H01L 29/0649* (2013.01); *H01L 29/402* (2013.01); *H01L 29/6609* (2013.01); *H01L 29/7824* (2013.01)

(58) Field of Classification Search
CPC . H01L 29/861; H01L 29/0649; H01L 29/402; H01L 29/6609; H01L 29/7824
See application file for complete search history.

(56) References Cited

U.S. PATENT DOCUMENTS

| 5,241,210 A * | 8/1993 | Nakagawa | H01L 21/74 257/487 |
| 6,242,763 B1 * | 6/2001 | Chen | H01L 27/0262 257/107 |
| 7,067,874 B2 * | 6/2006 | Nakamura | H01L 21/76232 257/328 |
| 7,078,740 B2 * | 7/2006 | Yamaguchi | H01L 29/0696 257/133 |
| 7,135,751 B2 * | 11/2006 | Jimbo | H01L 27/067 257/492 |
| 7,569,895 B2 * | 8/2009 | Arai | H01L 21/84 257/374 |
| 8,080,851 B2 * | 12/2011 | Barth, Jr. | H01L 21/761 257/355 |
| 8,710,617 B2 * | 4/2014 | Yamashita | H01L 28/60 257/496 |

(Continued)

*Primary Examiner* — Ida M Soward
(74) *Attorney, Agent, or Firm* — Brake Hughes Bellermann LLP

(57) ABSTRACT

A semiconductor device may include a Silicon on Insulator (SOI) substrate, and a diode formed on the SOI substrate, the diode including a cathode region and an anode region. The semiconductor device may include at least one breakdown voltage trench disposed at an edge of the cathode region, and between the cathode region and the anode region.

20 Claims, 17 Drawing Sheets

(56) References Cited

U.S. PATENT DOCUMENTS

| | | |
|---|---|---|
| 9,704,849 B2 * | 7/2017 | Laine .................... H01L 29/866 |
| 9,705,026 B2 * | 7/2017 | Willemen ................ H02H 3/20 |
| 10,276,556 B2 | 4/2019 | Agam et al. |
| 10,388,816 B2 * | 8/2019 | Rae ..................... H01L 27/1443 |
| 10,529,866 B2 * | 1/2020 | Tee ....................... H01L 29/861 |
| 2012/0032313 A1 * | 2/2012 | Yamamoto ............ H01L 29/868 |
| | | 257/657 |
| 2012/0139079 A1 | 6/2012 | Tokura et al. |
| 2013/0228891 A1 | 9/2013 | Kao et al. |
| 2014/0087530 A1 | 3/2014 | Salman |
| 2016/0104781 A1 | 4/2016 | Janssens et al. |

* cited by examiner

HIGH VOLTAGE DIODE ON SOI SUBSTRATE WITH TRENCH-MODIFIED CURRENT PATH

TECHNICAL FIELD

This description relates to diodes for Silicon on Insulator (SOI) devices.

BACKGROUND

Breakdown voltage (BV) of a diode, in which a large reverse current flow occurs while the diode is reverse-biased, is a fundamental diode property that governs potential uses of the diode. For example, it may be desirable to use a diode as a blocking diode, or for electrostatic discharge (ESD) protections. In these and similar capacities, it may be desirable to ensure that a maximum reverse voltage that occurs at the diode is less than the breakdown voltage of the diode.

In Silicon on Insulator (SOI) technologies, bulk Silicon is covered with an insulator, which is itself covered with another layer of Silicon, on which devices and other structures are formed. SOI technologies have a number of known advantages that relate to miniaturization of circuits and devices. For example, isolation of circuits from the bulk Silicon by the intervening insulator results in lower parasitic capacitances, lower leakage currents, and higher power efficiencies.

It is also desirable to form different types of circuits on a single SOI substrate, in order to pursue miniaturization further, increase a speed and reliability of the circuits, facilitate interconnections between the circuits, and make associated manufacturing processes more efficient and cost-effective. For example, it is possible to include logic circuits, analog circuits, and power circuits on a single SOI substrate.

Although techniques exist for isolating such circuits from one another on a SOI substrate, the presence of power circuits in particular indicates a need for inclusion of high (breakdown) voltage diodes. However, conventional techniques do not provide a practical manner of forming diodes with sufficiently high BV for isolated circuits on SOI substrates.

SUMMARY

According to one general aspect a semiconductor device includes a Silicon on Insulator (all) substrate, and a diode formed on the SOI substrate, the diode including a cathode region and an anode region. The semiconductor device may include at least one breakdown voltage trench disposed at an edge of the cathode region, and between the cathode region and the anode region.

According to another general aspect, a semiconductor device may include a substrate, and a diode formed in the substrate, the diode including a cathode region and an anode region. The semiconductor device may include at least one trench insulator adjacent to the cathode region that defines a diode current path around the at least one trench insulator that traverses the substrate between the cathode region and the anode region.

According to another general aspect, a method of making a semiconductor device may include forming a Silicon on Insulator (SOI) substrate, and forming a breakdown voltage trench in the SOI substrate. The method may further include forming a diode in the SOI, including forming a cathode region of the diode adjacent to the breakdown voltage trench, with the breakdown voltage trench between the cathode region and the anode region.

The details of one or more implementations are set forth in the accompanying drawings and the description below. Other features will be apparent from the description and drawings, and from the claims.

DETAILED DESCRIPTION

As described in detail below, embodiments include a compact, high-voltage diode on a Silicon-on-Insulator (SOI) substrate using a cathode-adjacent trench to modify a current path of the diode, and increase a breakdown voltage of the diode under reverse current conditions. The compact, high-voltage diode may be manufactured inexpensively, including forming the trench in conjunction with other types of trenches (e.g., isolation trenches) formed on the SOI substrate. Accordingly, reliable diode performance may be obtained.

Figure 1A:
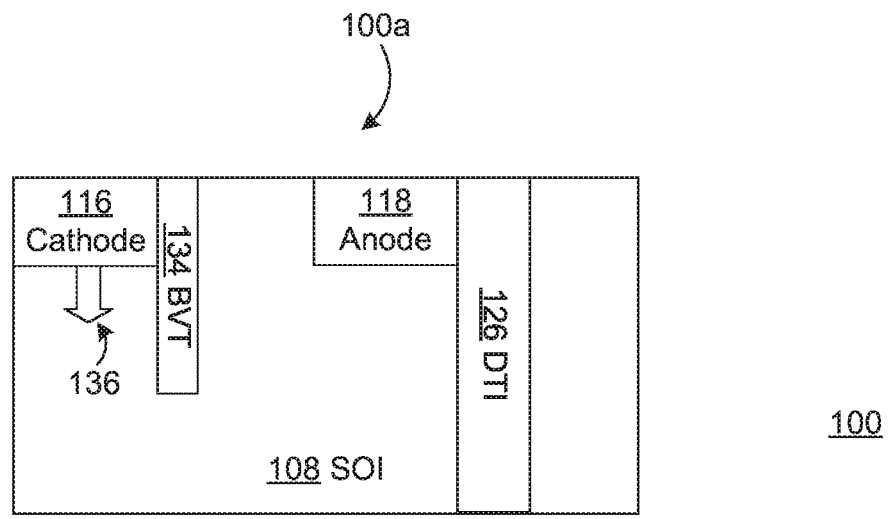
FIG. 1A illustrates a simplified cross-section of a high voltage diode with a trench-modified current path, according to some example implementations.
Figure 1B:
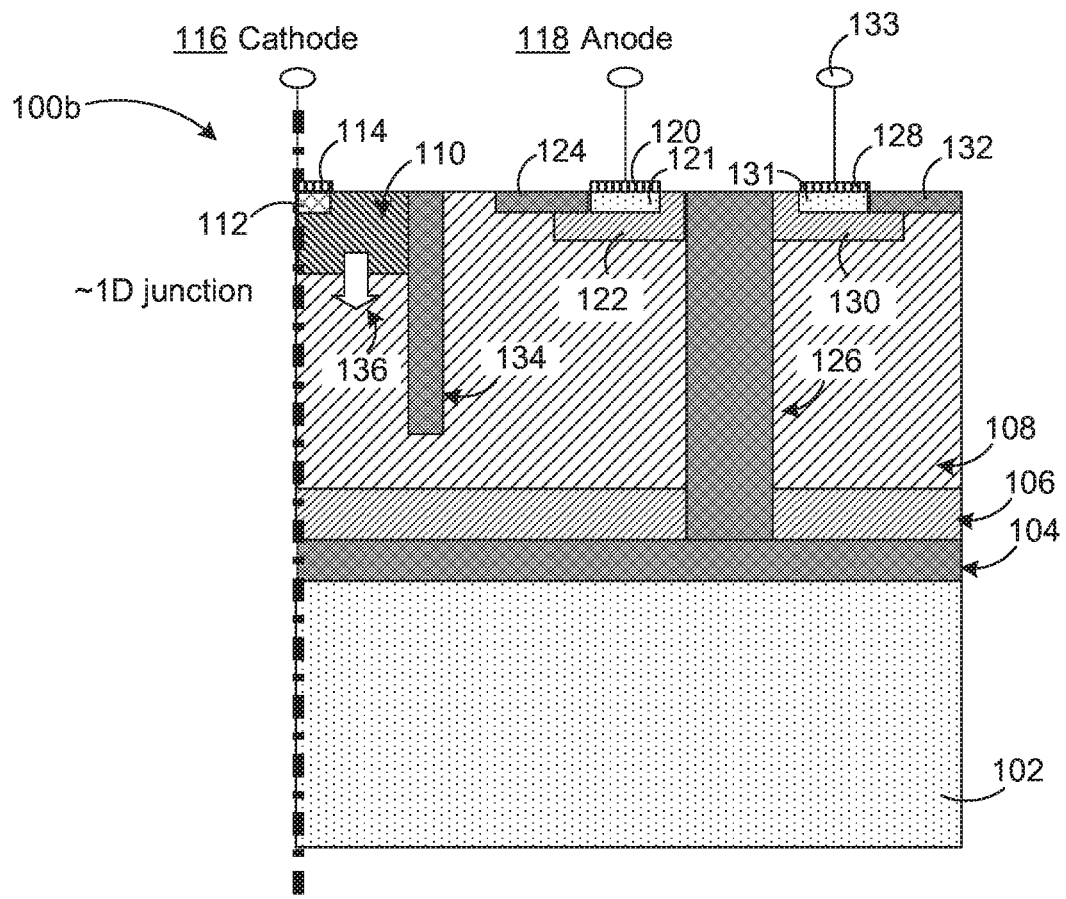
FIG. 1B illustrates a more detailed example implementation of the cross-section of FIG. 1A.

FIG. 1A illustrates a simplified cross-section of a high voltage diode 100A with a trench-modified current path 136, according to some example implementations. FIG. 1B illustrates a more detailed example implementation of the cross-section of FIG. 1A. FIGS. 1A and 1B are numbered consistently (i.e., like numerals indicate like elements), for clarity of description.

In the simplified example of FIG. 1, the diode 100a includes a cathode 116 and an anode 118, formed in a Silicon on Insulator (SOI) layer 108. As referenced above, and as may be seen in the top view of FIG. 2, discussed below, the diode 100a may be isolated from other circuits by an isolating trench, referred to as a Deep Trench Isolation (DTI) structure 126. In particular, for example, the DTI 126 may be designed to isolate the diode 100a from high voltage power circuits that are also formed in the SOI 108.

Nonetheless, in various usage scenarios, including unintended short circuits, electrostatic discharge events, and other malfunctions, the diode 100a may be exposed to large reverse voltages, and may be required to withstand an associated, large breakdown voltage (BV). In conventional diodes, reverse current flow is governed by an electric field (and associated lateral doping profile) in the cathode region, and specifically, for example, by a critical electric field at an edge of a $N_{well}$ cathode region, at a PN junction with a p-type SOI layer. Therefore, it is possible to obtain marginal increases in BV by increasing a lateral distance or spacing between cathode and anode regions in conventional diodes.

In FIG. 1A, however, a breakdown voltage trench (BVT) 134, which may also be referred to as a trench insulator 134, or an insulating trench 134, modifies an electric field distribution in a region of the cathode 116, and associated reverse current path 136 between the cathode 116 and the anode 118. Specifically, as shown, the BVT 134 causes the current path 136 to be at least quasi-vertical, e.g., travelling at least partially in a direction of an insulator on which the SOI layer 108 is formed (not shown in FIG. 1A; illustrated as insulator layer 104 of FIG. 1B). Put another way, the BVT 134 is formed to a depth that extends beyond a depth of the cathode 116, but without reaching a bottom of the SOI layer 108, so that at least a portion of the SOI layer 108 is available for the trench-modified current path 136 to flow therethrough between the cathode 116 and the anode 118.

Thus, by including the BVT 134, it is possible to eliminate the just-referenced lateral portion of a PN junction between a conventional cathode region and adjacent P-type SOI layer. For example, the example of FIG. 3, below, illustrates an electric field having an electrostatic potential that is strongest in a region of the cathode 116, and weakens vertically along a length of the BVT 134, consistent with the illustrated flow of the trench-modified current path 136.

Figure 7:
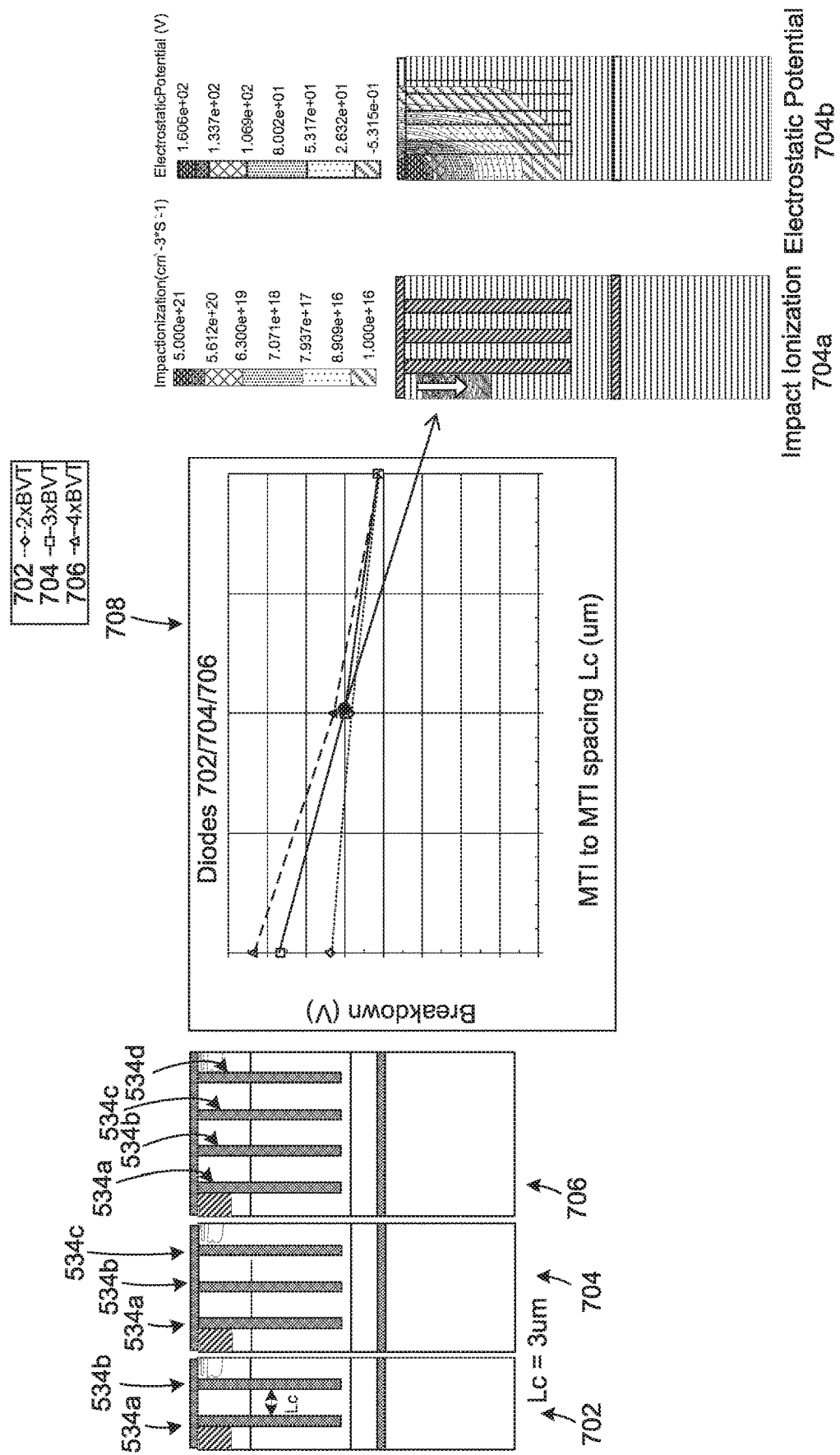
FIG. 7 illustrates relationships between structures, breakdown voltages, and electric field distribution of the example implementation of FIGS. 5B and 6.
Figure 9:
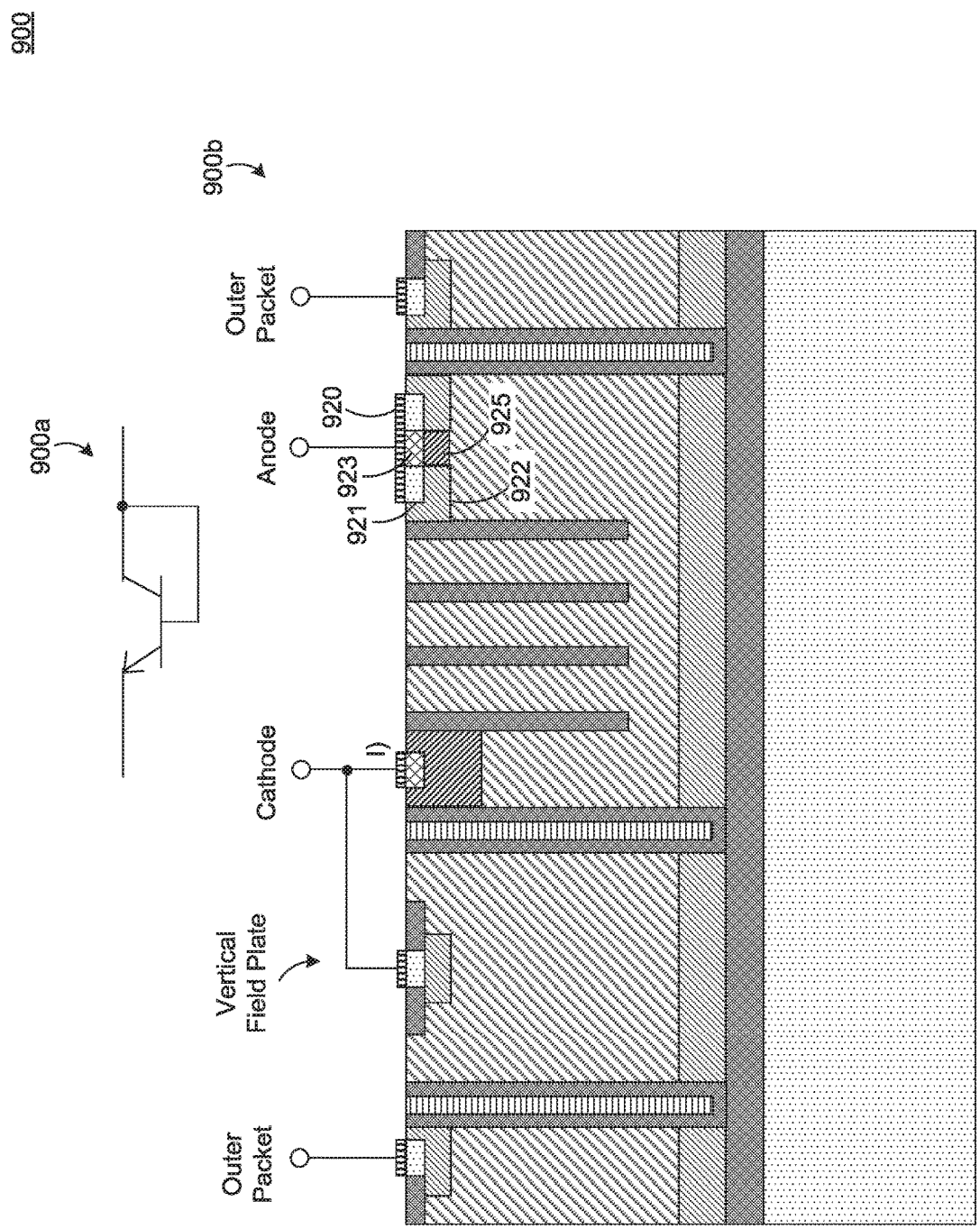
FIG. 9 illustrates a fourth example implementation of a high voltage diode.
Figure 10:
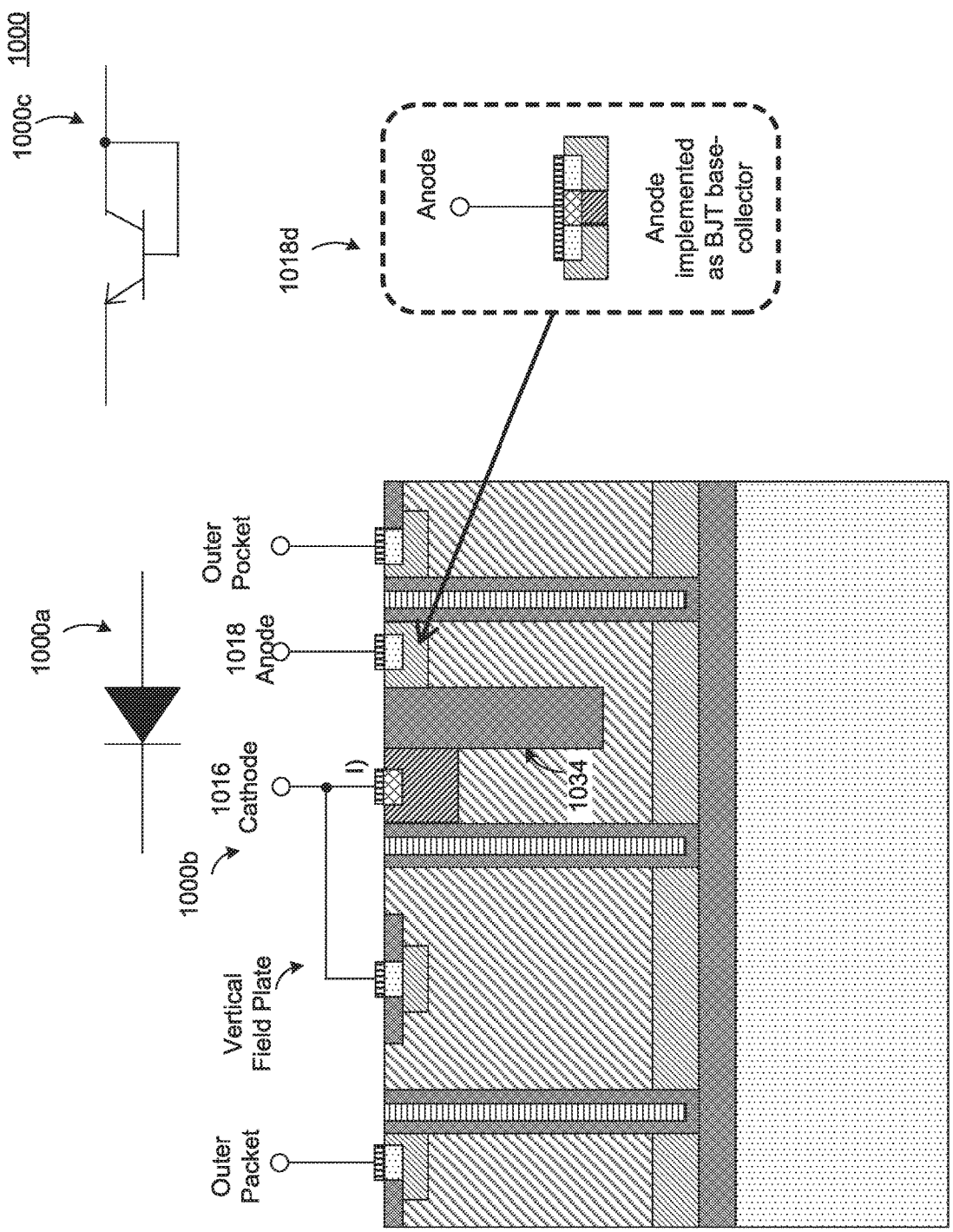
FIG. 10 illustrates a fifth example implementation of a high voltage diode.

The simplified examples of FIG. 1A illustrates a single BVT 134 with an illustrated width and depth, but in various other implementations, it is possible to vary these and other BVT parameters. For example, multiple BVTs may be included, as shown in FIGS. 5, 7, and 9. A width of each BVT may be varied, as illustrated in FIG. 10, and a depth of the BVT 134 may also be varied. Further, spacing between multiple BVTs may be varied, as well as spacing between the anode 118 and a BVT 134 nearest the anode 118.

As described in detail, below, appropriate design choices made with respect to the above-referenced (and similar) parameters enable a degree of control over a resulting breakdown voltage. For example, a conventional SOI diode without the BVT 134 may be rated for a breakdown voltage in a range of 90V. By adding the BVT 134, the diode 100a may have a breakdown voltage in a range of at least 140V, enabling an operating range of, e.g., 120V. As referenced above, and described and illustrated in detail, below, variations in design parameters associated with the BVT 134 (e.g., variations in BVT number, width, or spacing) enable further BV increases, as well.

Advantageously, the BVT 134 may be formed using a process flow that similar to a process flow used to form the DTI 126. In some examples, as illustrated in the examples of FIGS. 11-16, the BVT 134 may be formed together with the DTI 126 in the same process step(s), by varying certain process parameters (e.g., size of mask opening). As a result, the various benefits of the BVT 134 described herein may be obtained in a cost-effective, reliable, efficient manner.

Other design variations are also possible. For example, as illustrated and described with respect to FIG. 4, the BVT 134 may be formed with an internal airgap. As also described and illustrated with respect to FIG. 4, an additional N type layer may be disposed in the P-type anode (and electrically shorted to the P-type anode), converting the diode into a BJT diode, so that the N layer forms the collector of a lateral NPN BJT, in which the original cathode acts as emitter, the original P anode acts as base, and the newly added N type layer acts as collector.

In the more detailed example of FIG. 1B, the diode 100b is illustrated as being formed using a bulk Si substrate 102, having an insulator layer 104 form thereon. For example, the bulk silicon substrate 102 may have a P+ type doping, while the layer 104 may be formed using an oxide or other suitable insulator, and may be referred to as a buried oxide, or BOX.

An anti-back gate layer (ABG layer) 106 may be formed on the BOX layer 104. The ABG layer may also have a P+ type doping concentration, and is known to be useful in shielding the diode 100b, and other circuits formed on the SOI 108, from a potential of the substrate 102.

The SOI layer 108 may represent a P type silicon layer formed on the layers 102, 104, 106, in which various devices and circuit elements, including the diode 100A, 100B, may be formed. Specifically, as shown, the cathode 116 may include an N type layer 110, (e.g., $N_{well}$ or $N_{well}/N_{resurf}$) may be formed within the SOI layer 108. An N type contact layer ($N_{imp}$) 112 may be formed in the N type region 110, and a metal contact (e.g., silicide) 114 may be formed on the N type contact layer 112. Thus, as shown, the regions/layers 110, 112, 114 may be understood to represent the cathode 116 of the diode 100a and 100b.

The anode 118 of the diode 100A, 100B may be formed using, or may include, a metal contact 120 electrically connected to a P type contact layer (e.g., $P_{imp}$) 121, thereby providing electrical contact to a P type anode region 122 (e.g., $P_{well}$). A shallow trench isolation (STI) region 124, e.g., a suitable oxide, may be formed adjacent to the P type contact layer 121 and the P type anode region 122.

Further in FIG. 1B, the deep trench isolation (DTI) region 126 is illustrated as isolating the above-described structures of the diode 100a, 100b, including the cathode 116 and the anode 118, from other circuit elements, or other regions, that may be formed on or in the SOI layer 108. Like the STI 124, the DTI 126 may be formed using a suitable oxide. In some implementations, the DTI 126 may be formed with a polysilicon layer formed therein.

For purposes of illustration of a function and purpose of the DTI 126, an outer pocket region 133 is illustrated as including a P type region 130, a shallow trench isolation region 132, a P type contact layer 131, and a metal contact 128. For purposes of description of FIG. 1, it will be appreciated that the outer pocket 133, and illustrated elements thereof, are included merely to illustrate an isolation function of the DTI 126, and are therefore not described further herein in detail.

In the example of FIG. 1B, the BVT 134 may be understood from the above description of FIG. 1A to be configured to modify the current path 136 of the diode 100b between the cathode 116 and the anode 118. Specifically, the BVT 134 redirects the current flow, causing the current path 136 to extend primarily in a substantially vertical direction, i.e., in a direction toward the BOX layer 104.

As referenced above with respect to FIG. 1A, various design parameters of the BVT 134 may be associated with variations in the breakdown voltage of the diode 100b. For example, the breakdown voltage may depend on a relative width of the BV trench 134, as well as on a spacing between the BVT 134 and the anode 118. In implementations in which a plurality of BVTs 134 are included (e.g., FIGS. 5, 7, 9), a resulting breakdown voltage may vary in accordance with related factors, such as the total number of BVTs included, as well as an extent of the spacing between the BVTs. As with the STI 124 and the DTI 126, the BVT 124 may be formed using a suitable oxide. In some example implementations illustrated and described below, the BVT 134 may be formed with an airgap included therein.

Figure 2:
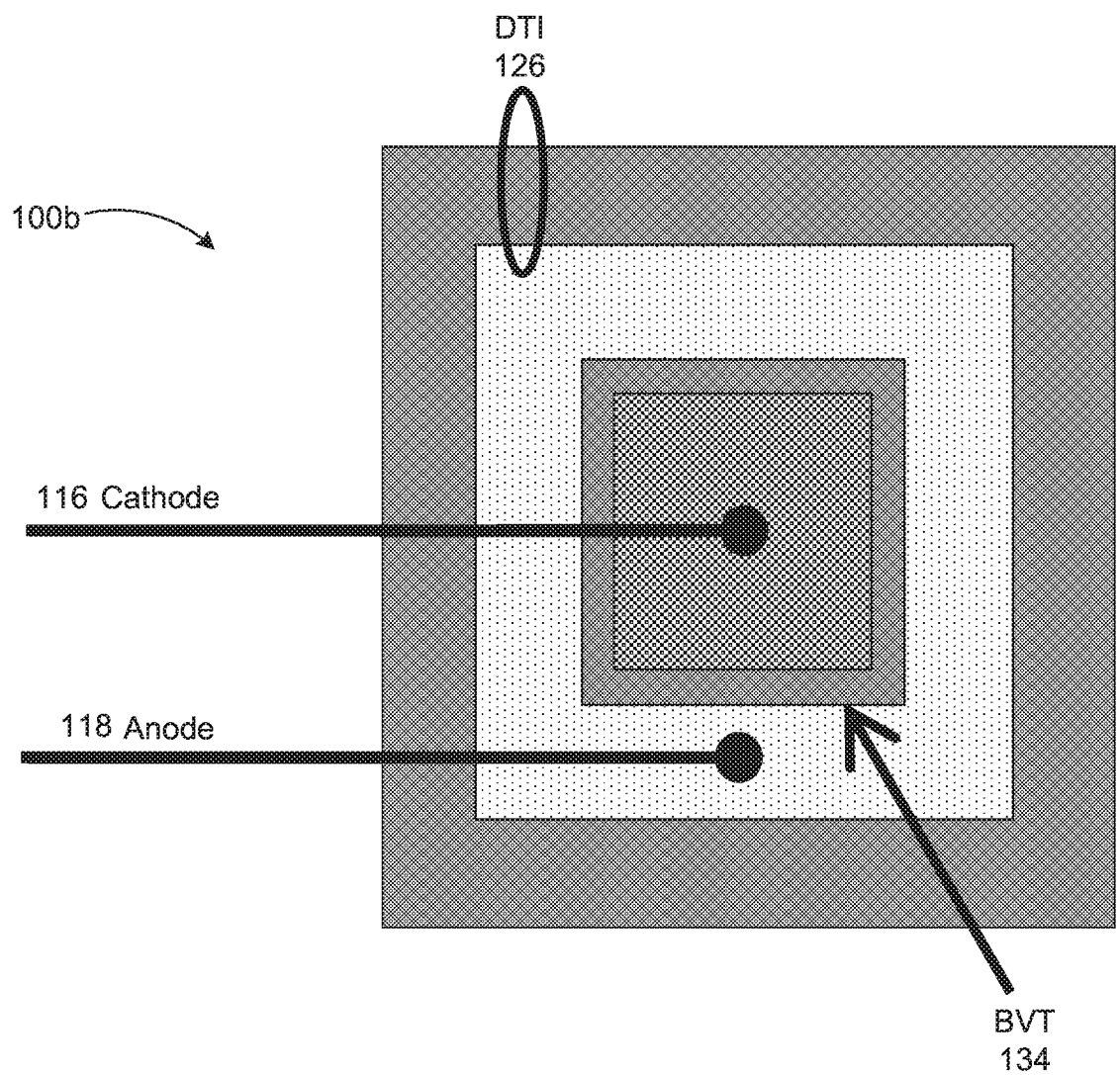
FIG. 2 is a top view of the example high voltage diode of FIG. 1B.

FIG. 2 is a top view of the diode 100b of FIG. 1B. As illustrated, the BVT 134 may be configured to surround the cathode 116, in a region between the cathode 116 and the anode 118. As also illustrated, the diode 100b may be isolated from other circuit elements by the DTI 126.

Figure 3:
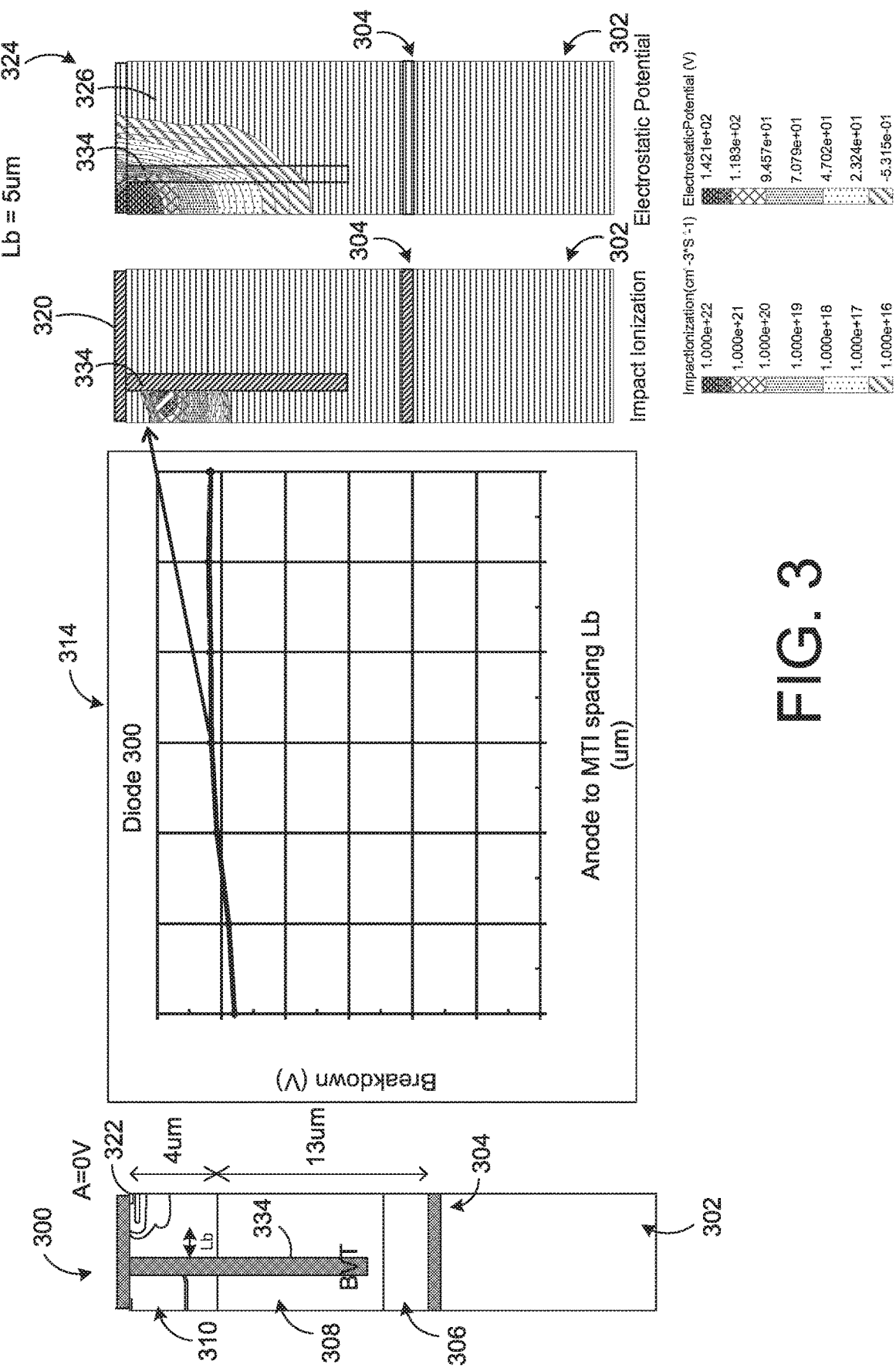
FIG. 3 illustrates relationships between a structure, breakdown voltage, and electric field distribution of the high voltage diode of FIGS. 1B and 2.

FIG. 3 illustrates a simplified diode 300, corresponding generally to the diode 100b of FIG. 1. As shown, the diode 300 includes a bulk silicon layer 302, a BOX layer 304, and an ABG layer 306. A SOI layer 308 has a BVT 334 formed therein, which separates a cathode region 310 from an anode region 322. As shown, the BVT 334 is adjacent to an edge of the cathode region 310, and extends vertically in a direction of the BOX 304.

Also in FIG. 3, a spacing $L_b$ is illustrated between the BVT 334 and the anode region 322. As referenced above, and as illustrated with respect to graph 314, a breakdown voltage of the diode 300 may vary in accordance with the spacing $L_b$.

In conventional SOI diodes, without the BVT 334, the breakdown voltage is generally limited by a lateral doping profile of the cathode region of the diode. That is, in conventional diodes, a radius of curvature of a cathode region resulting from diffusion/implantation will dictate an electric field strength at the points of curvature, and breakdown typically occurs in regions in which the breakdown field is reached first.

As referenced above, conventional approaches may seek to enhance a breakdown voltage of an SOI diode by increasing a spacing between the cathode and anode regions. Consequently, in conventional scenarios, it is difficult to form compact diodes, because limiting the cathode/anode spacing will also reduce a breakdown voltage of the diode. Further, even in scenarios in which it is feasible to increase the cathode/anode spacing, associated increases in breakdown voltage experience a point of diminishing returns, so that even relatively large cathode/anode spacings result in breakdown voltages of, e.g., less than 100 volts, e.g., approximately 90 volts.

In contrast, as illustrated in the graph 314 of FIG. 3, inclusion of the BVT 334 causes an increase in breakdown voltage for the diode 300 across a wide variety of spacings $L_b$, e.g., a range of 2-8 microns As shown, the high breakdown voltage occurs even at relatively small spacings $L_b$, allowing for compact construction of the diode 300. For example, the breakdown voltage in the example of FIG. 3 may be increased to approximately 140V, or within a range of, e.g., 130-150V, allowing for compact diode construction with reliable breakdown voltage in ranges under 140V, e.g., for 120V operation scenarios.

Further in FIG. 3, an impact ionization graph 320 illustrates that, for the illustrated BV and corresponding $L_b$ spacing, impact ionization at a point of breakdown (at which an associated electric field, shown in graph 324, reaches a critical magnitude, and at which avalanche breakdown occurs) is strongest in an area below the cathode region 310, and extends at least semi-vertically toward the BOX layer 304. Similarly, an electrostatic potential 324 is illustrated by field lines 326 as being strongest in a region of the cathode region 316, and extending at least semi-vertically in a direction of the BOX layer 304.

Figure 4:
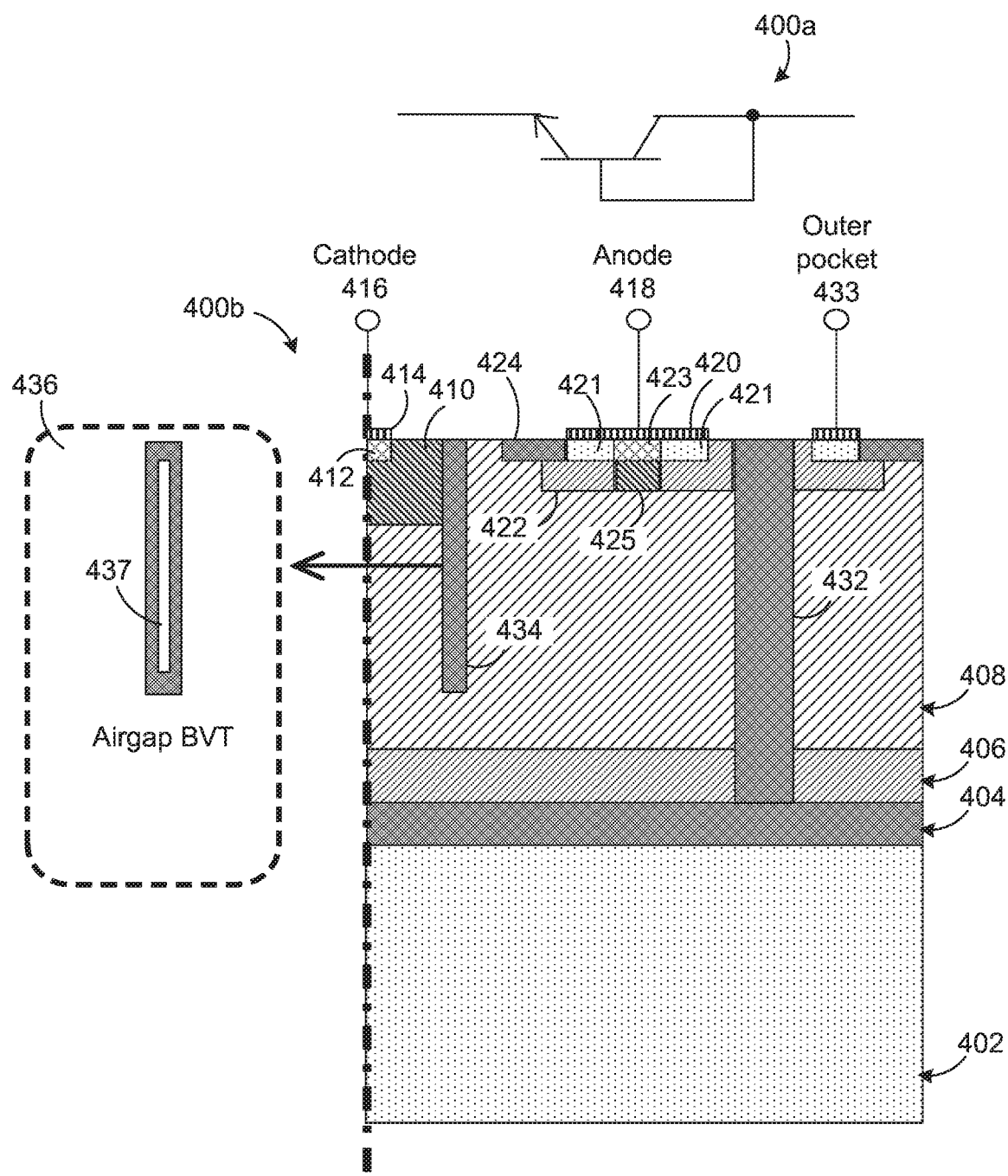
FIG. 4 illustrates a cross section of a second example implementation of the high voltage diode of FIG. 1A.

FIG. 4 illustrates an alternate example implementation of the diode 100 of FIG. 1. In FIG. 4, the diode 400 is illustrated as a bipolar junction transistor (BJT) diode 400a (i.e., a diode-connected BJT), with a corresponding structure 400b.

Many of the structural elements of the diode 400b are similar to, and numbered consistently with, the diode 100b of FIG. 1. Thus, for example, the diode 400b includes a bulk silicon substrate 402, a BOX layer 404, and an ABG layer 406. A silicon layer 408 has a cathode region 410 form therein, in which an N type contact layer 412 is electrically connected to a metal contact 414, thereby forming cathode 416.

Further in FIG. 4, an anode 118 includes metal contact 420, P type contact layer 421, and N type contact layer 423. As further illustrated, an $N_{well}$ region 425 is included in the $P_{well}$ anode region 422. An STI region 424 is adjacent to the anode 118, e.g., is adjacent to the P type contact layer 421, as shown. DTI 432 isolates the diode 400B from an outer pocket 433. Thus, as referenced above, the diode 400b forms a quasi-vertical diode, which may have, e.g., an improved forward current as compared to the embodiment of FIG. 1B.

In the example of FIG. 4, a BVT 434 is illustrated as being adjacent to the N type cathode region 410. The BVT 434 serves a same or similar purpose as already described above with respect to FIGS. 1-3, but in the context of the diode 400B of FIG. 4. Thus, for example, the BVT 434 enables a vertical or quasi vertical current flow, and associated increase in breakdown voltage, for the diode 400b.

FIG. 4 also illustrates that the BVT 434 may be implemented in alternate embodiments as an air gap BVT 436. That is, as illustrated, the BVT 434 may be formed with an airgap 437 formed therein. Of course, other variations of the BVT 434, some of which are described herein, may also be implemented, including varying a width of the BVT 434, and/or including multiple instances of the BVT 434/436.

Figure 5A:
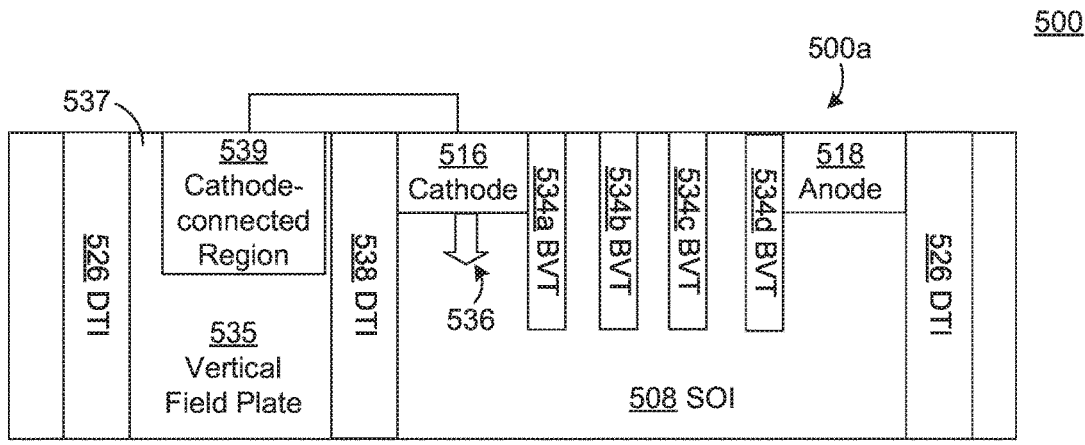
FIG. 5A illustrates a simplified cross-section of another example implementation of a high voltage diode, with a vertical field plate for increased breakdown voltage.
Figure 5B:
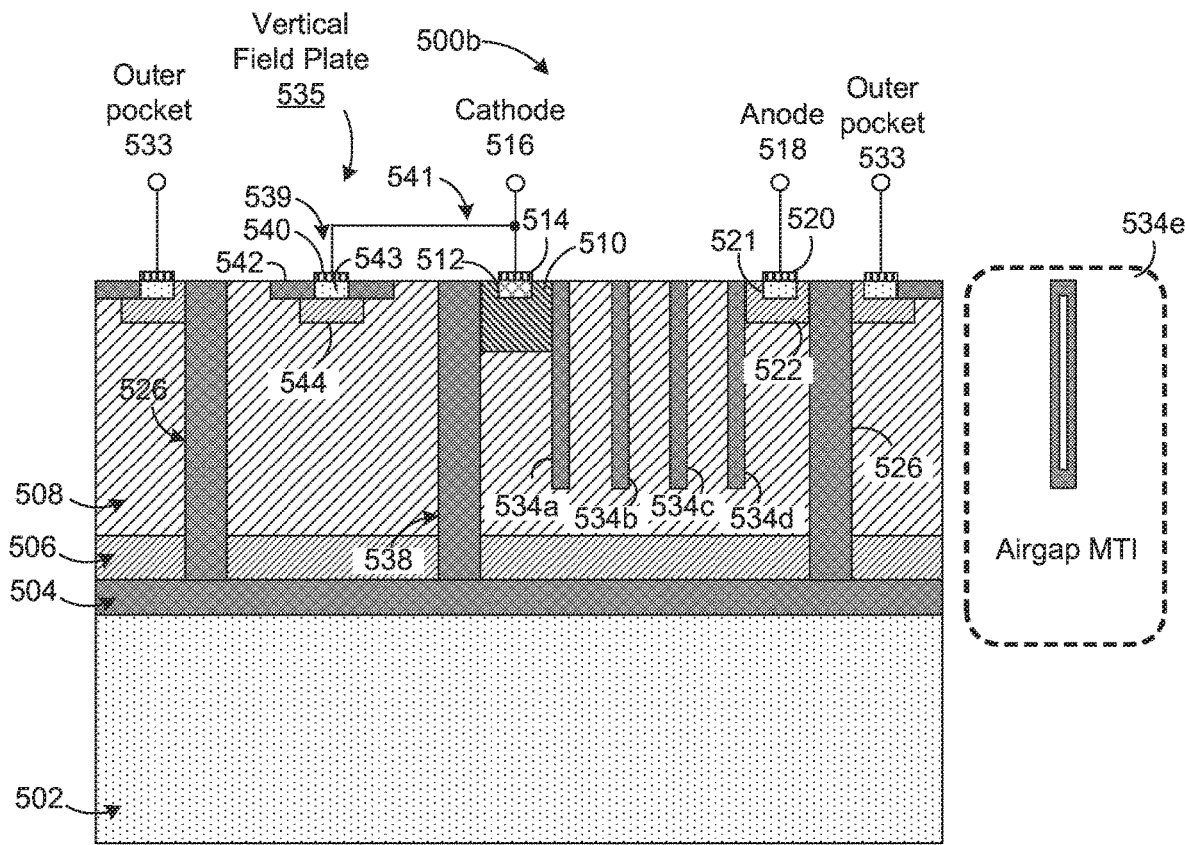
FIG. 5B illustrates a more detailed example implementation of the simplified cross-section of FIG. 5A.

FIG. 5A illustrates a simplified cross-section of another example implementation of a high voltage diode, with a vertical field plate 535 for increased breakdown voltage. FIG. 5B illustrates a more detailed example implementation of the simplified cross-section of FIG. 5A. As with FIG. 4 above, many of the elements of FIGS. 5A and 5B are the same as, or similar to, corresponding elements in FIGS. 1A and 1B, and are numbered consistently where possible.

In FIG. 5A, the diode 500a is illustrated as including a plurality of BVTs 534a, 534b, 534c, and 534d. As referenced above, and described and illustrated in more detail, below, including multiple BVTs may have an enhanced effect with respect to raising a BV of the diode 500a, as compared to the single BVT 134 of FIGS. 1A and 1B.

Further, as also referenced, a vertical field plate 535 may further enhance the BV of the diode 500a. As illustrated, the vertical field plate 535 includes a DTI 538 and a cathode-connected region 539. A region 537 of the SOI layer 108 is thus isolated by the DTI 538 and the existing DTI 526, and is referred to herein as trench-isolated region 537.

By connecting the cathode-connected region 539 to the cathode 516 using metal connection 541, the vertical field plate 535 may be observed to provide a pocket, e.g., a P-type epitaxial (PEPI) pocket. As illustrated below with respect to FIG. 7, the vertical field plate 535 positively modifies an electric field distribution as compared to the example electric field distribution 326 of FIG. 3. As a result, a vertical aspect of the current 536 is enhanced, and a BV of the diode 500a is increased. For example, a BV of the diode 500b may be in the range of, e.g., 240V.

In FIG. 5B, the diode 500b is illustrated as including bulk silicon 502, BOX layer 504, ABG layer 506, and SOI 508. Similarly, a cathode $N_{well}$ region 510 is illustrated as having contact layer 512 form therein. Metal contact 514 is electrically connected to the metal contact layer 512, to thereby form cathode 516. Anode 518 is illustrated as including a metal contact 520 electrically connected to metal contact layer 521, which is itself formed within region 522. Also in FIG. 5, DTI 526 is illustrated as isolating the diode 500B an outer pocket 533.

As in the simplified examples of FIG. 5A, FIG. 5B includes the plurality of BVT's 534a, 534b, 534c, 534d. Diode 500b also illustrates a more detailed example of the vertical field plate 535. Specifically, in FIG. 5B, the cathode-connected region is illustrated as including a metal contact 540, shallow trench isolation structure 542, metal contact layer 543, and $P_{well}$ region 544. However, other suitable constructions for the cathode-connected region 539 may be used, e.g., structures that are easy to form in the context of the manufacturing processes required for the diode 500b as a whole, and that enable the desired electrical connection to the cathode 116.

In various implementations of the example structure of FIG. 5B, one or more of the BVT's 534a-534d may be implemented using an air gap BVT 534e, in which, as illustrated, and as referenced above, the BVT 534e may be formed with an air gap included therein. Similarly, one or more (e.g., either or both) of the deep trenches 526, 538 may be formed with a polysilicon material included therein. If included, such a DTI poly may be left floating, as a dielectric material.

Figure 6:
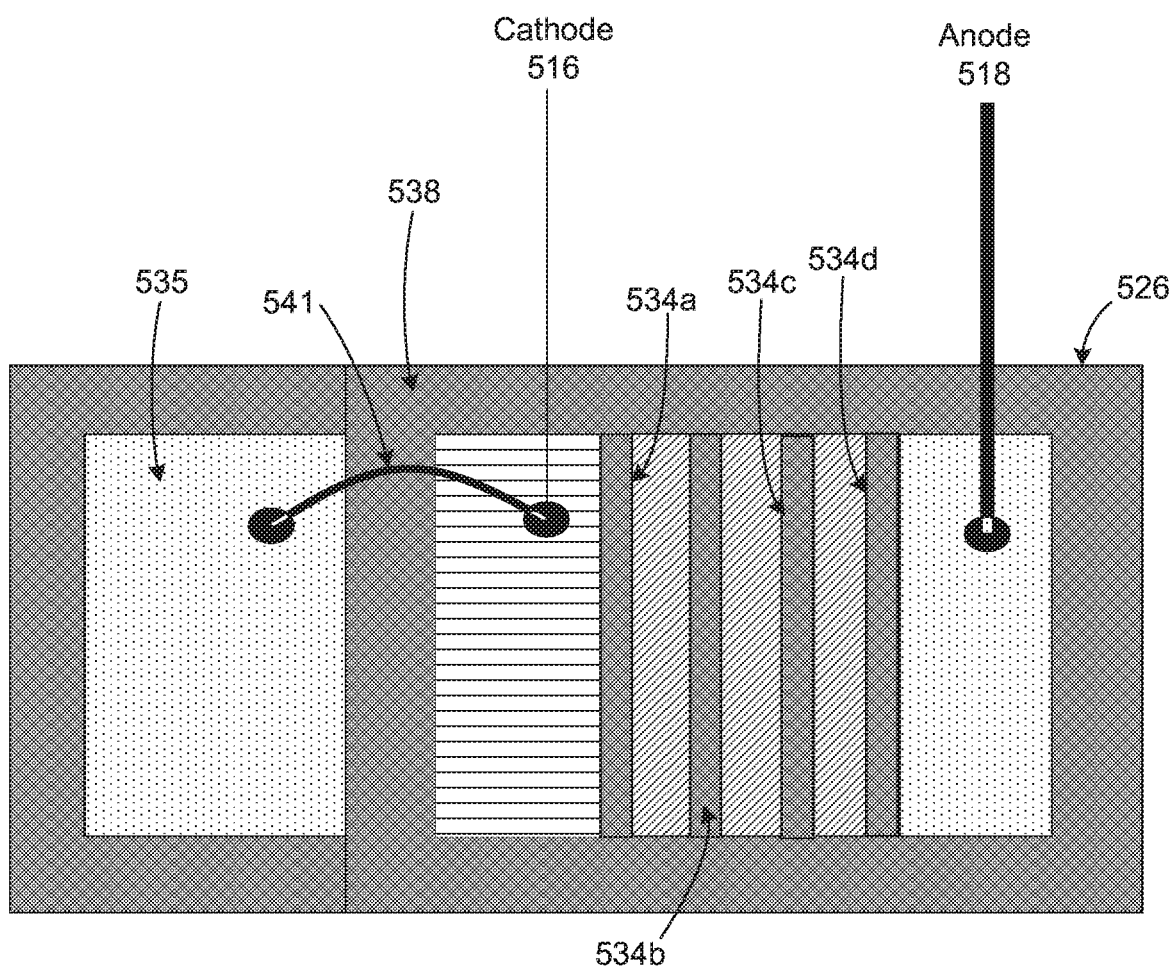
FIG. 6 is a top view of the example implementation of FIGS. 5B and 6.

FIG. 6 is a top view of the example implementation of FIG. 5. As illustrated, the vertical field plate 535 may be formed in which deep trench 538 and deep trench isolation structure 526 are constructed and implemented to provide isolation of the vertical field plate 535. As shown and described, the vertical field plate 535 may be connected to the cathode 516 using metal connection 538.

FIG. 7 illustrates examples of various implementations of the diode 500b of FIG. 5B. Specifically, FIG. 7 illustrates variations in design choices made with respect to a number and spacing of BVT's 534. For example, FIG. 7 illustrates a first example implementation 702 in which two BVT's 534a, 534b are included, with a spacing there between denoted as $L_c$. An implementation 704 includes an additional BVT 534c, and an implementation 706 includes BVT's 534A-534d.

Graph 708 illustrates an example relationship between breakdown voltage and BVT to BVT spacing $L_c$ for the implementations 702, 704, 706. As illustrated in the graph 708, in general, increasing a number of BVT's is associated with increasing a total breakdown voltage. For relatively smaller spacings $L_c$, it may be beneficial to include additional BVT's. For a given number of BVT's, a smaller cathode to anode spacing is implied. For example, $L_c$ may be in a range of, e.g., 1-3 microns. Resulting/corresponding breakdown voltages may be in a range of, e.g., 140-190V FIG. 7 further illustrates, as referenced above, that breakdown voltage is correlated with, or defined by, a vertical electric field for a given termination. For example, FIG. 7 illustrates impact ionization 704A showing an enhanced vertical aspect, as compared to the impact ionization 320 of FIG. 3. Similarly, electrostatic potential 704B is illustrated as having an enhanced vertical aspect and distribution, due to inclusion of the BVT's 534A, 534B, 534C.

Figure 8:
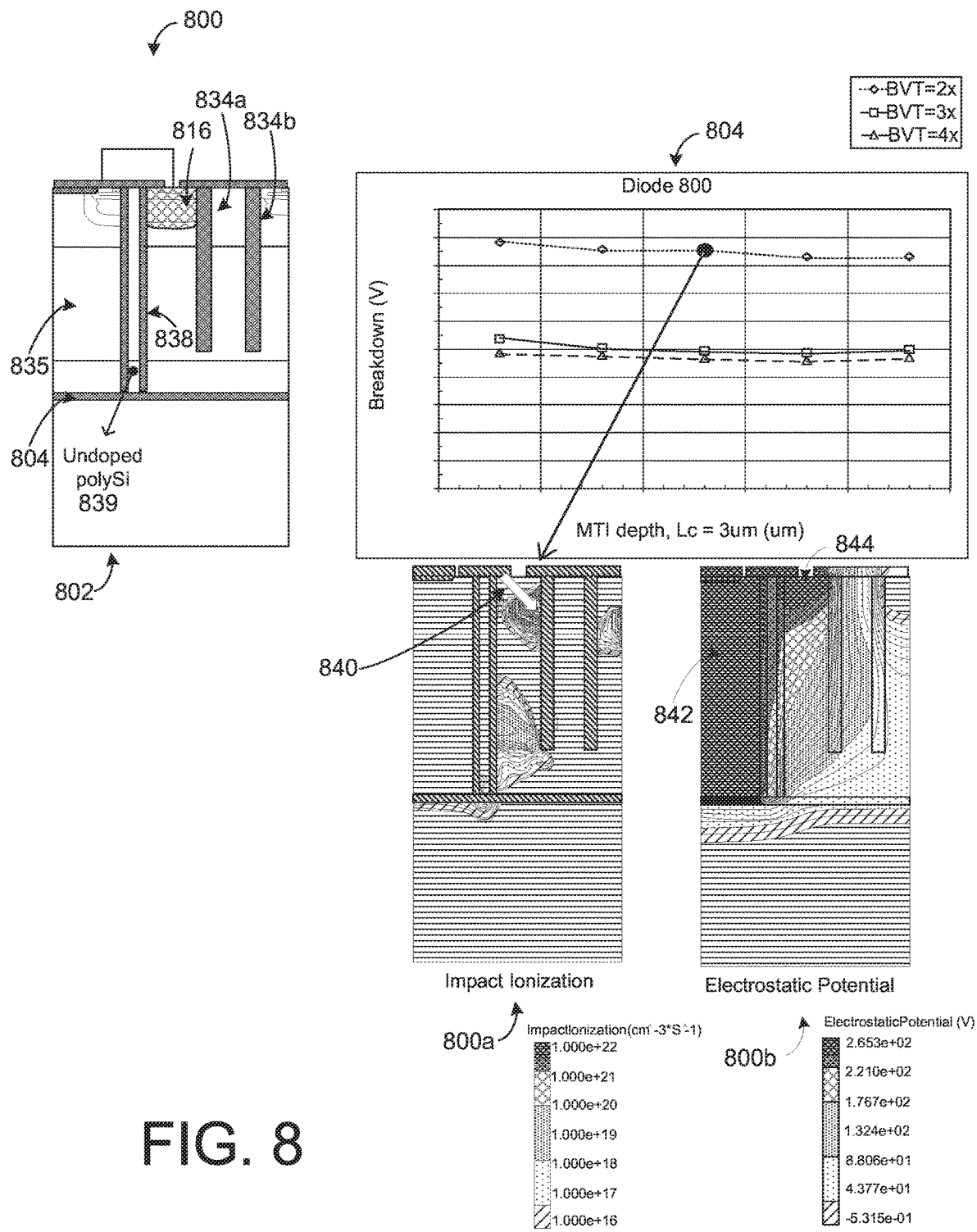
FIG. 8 illustrates further example relationships between the structure, breakdown voltage, and electric field distribution of the example implementation of FIGS. 5B and 6.

FIG. 8 illustrates further example implementations and associated effects, with respect to the vertical field plate 535. As shown in the example, a diode 800 is formed on SOI layer 802 and BOX 804, and includes two BVTs 834a, 834b, as well as a vertical field plate 835 connected to cathode 816. A DTI 838 isolates the pocket of the vertical field plate 535, as described above with respect to FIGS. 5 and 6. As referenced above, the DTI 838 may include undoped PolySi 839.

Graph 804 illustrates example relationships between a number of included BVTs (e.g., 2, 3, or 4 BVTs) and corresponding breakdown voltages. As shown, for a given set of design choices/parameters, some implementations may have a maximum BV with two BVTs, and may experience diminishing or negative improvements by including additional BVTs. In the example of graph 804, for a given $L_c$ of 3 microns, BV may be in a range between, e.g., 220V and 280V. For example, for 3 or 4 BVTs, BV may be in a range of about 220-240, while 2 BVTs in the example may have a BV in a range of, e.g., 260V-270V.

Further in FIG. 8, graph 800a illustrates, with arrow 840, a direction of an electric field which is changed from a vertical direction as shown in FIG. 7, 704a, due to the vertical field plate 835, to more of a diagonal direction. For a more vertical electric field, as in FIG. 7, 704a, a breakdown voltage may be limited by a thickness of the SOI layer. However, with more of a diagonal direction or orientation of the electric field, resulting from the vertical field plate 835, a higher breakdown voltage may be achieved for a corresponding/same SOI thickness. Graph 800b illustrates a corresponding electric field distribution. As may be observed in graph 800b, an electrostatic potential 842 is substantially the same as electrostatic potential 844, and a vertical aspect of the electric field and associated current is enhanced. In general, FIG. 8 demonstrates that the example implementations of FIGS. 5A and 5B, including the vertical field plate 535/835, provide an elimination of a gated diode otherwise formed by the $N_{well}$/Pepi PN junction on an opposite side of the $N_{well}$ from the BVT 534a.

FIG. 9 illustrates a fourth example implementation of a high voltage diode. In FIG. 9, the diode 900 is illustrated as a bipolar junction transistor (BJT) diode 900a (i.e., a diode-connected BJT), with a corresponding structure 900b. Many of the structural elements of the diode 900b are similar to, and numbered consistently with, the diodes 100b, 400b, and 500b of FIGS. 1B, 4, and 5B, and are therefore not repeated with respect to FIG. 9, for the sake of conciseness.

Also in FIG. 9, similar to FIG. 4, an anode 918 includes metal contact 920, P type contact layer 921, and N type contact layer 923. As further illustrated, an $N_{well}$ region 925 is included in the $P_{well}$ anode region 922. Thus, as referenced above, the diode 900*b* forms a quasi-vertical diode, which may have, e.g., an improved forward current as compared to the embodiment of FIG. 5B.

FIG. 10 illustrates a fifth example implementation of a high voltage diode. Specifically, FIG. 10 illustrates an example diode (illustrated as circuit element 1000*a*, and having a structure 1000*b*) in which a BVT 1034 is wider than the various BVT implementations (e.g., 134, 434, 534) illustrated above. Increasing a width of the BVT 1034 provides another design parameter for adjusting a breakdown voltage of the diode 1000*b* to a desired range. In the example of FIG. 10, the BVT 1034 extends through an entire spacing between, and is edge adjacent to each of, the well regions of cathode 1016 and anode 1018.

Further in FIG. 10, alternative implementations are illustrated in which a diode-connected BJT 1000*c* is implemented by replacing the anode 1018 with an alternate anode 1018*d* to form an anode implemented as BJT base-collector corresponding to circuit symbol 1000*c*. As with the example implementations of FIGS. 4 and 9, implementing the anode 1018 as BJT base-collector 1018*d* anode enables various advantages discussed above, e.g., greater forward current ranges.

Figure 11:
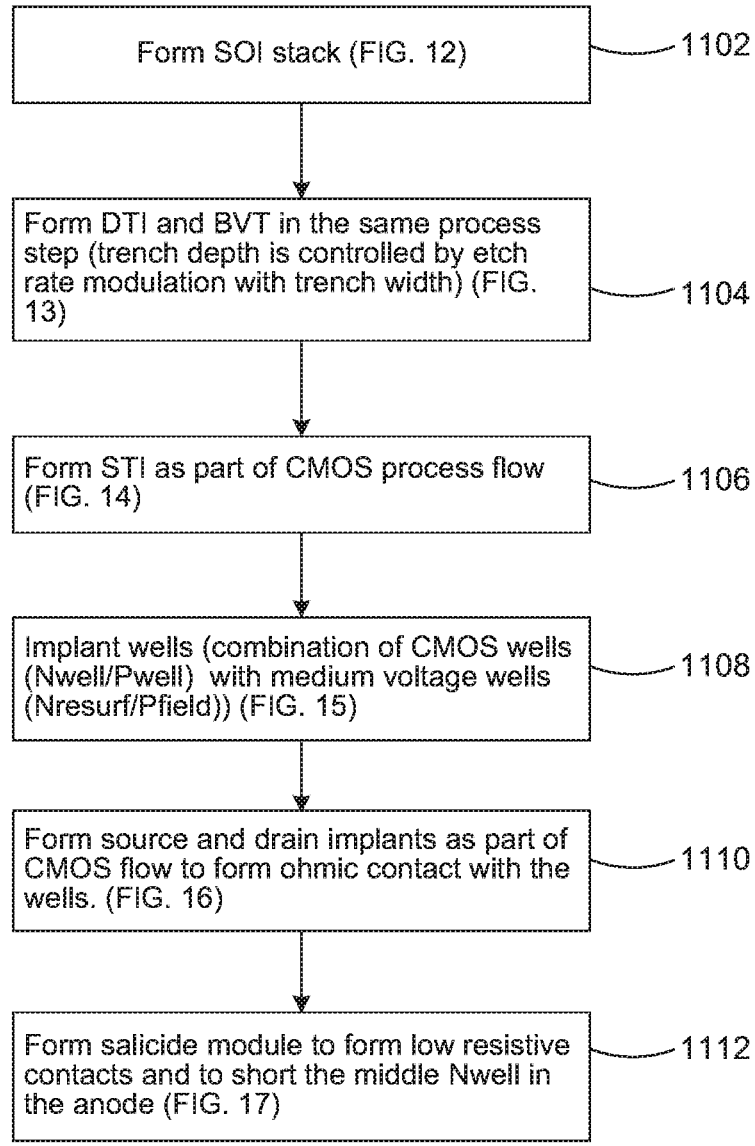
FIG. 11 is a flowchart illustrating examples process operations for forming aspects of the example implementation of FIG. 4.
Figure 12:
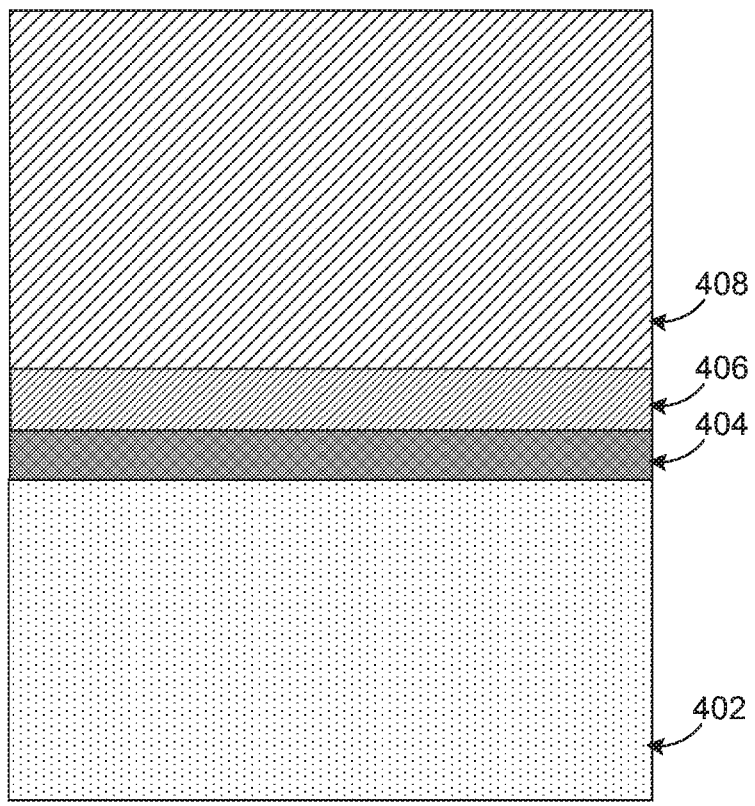
FIG. 12 is a structure illustrating an example of a first operation of the flowchart of FIG. 11.

FIG. 11 is a flowchart illustrating examples process operations for forming aspects of the example implementation of FIG. 4 (and using the same reference numerals used with respect to FIG. 4). As noted in FIG. 11, each operation 1102-1112 corresponds to one of subsequent FIGS. 12-17. In the example of FIG. 11, a SOI stack is formed (1102), as shown in FIG. 12. For example, the bulk Si layer 102, the BOX layer 104, the ABG layer 106, and the SOI layer (e.g, p-EPI layer) 108 may be formed in consecutive steps.

Figure 13:
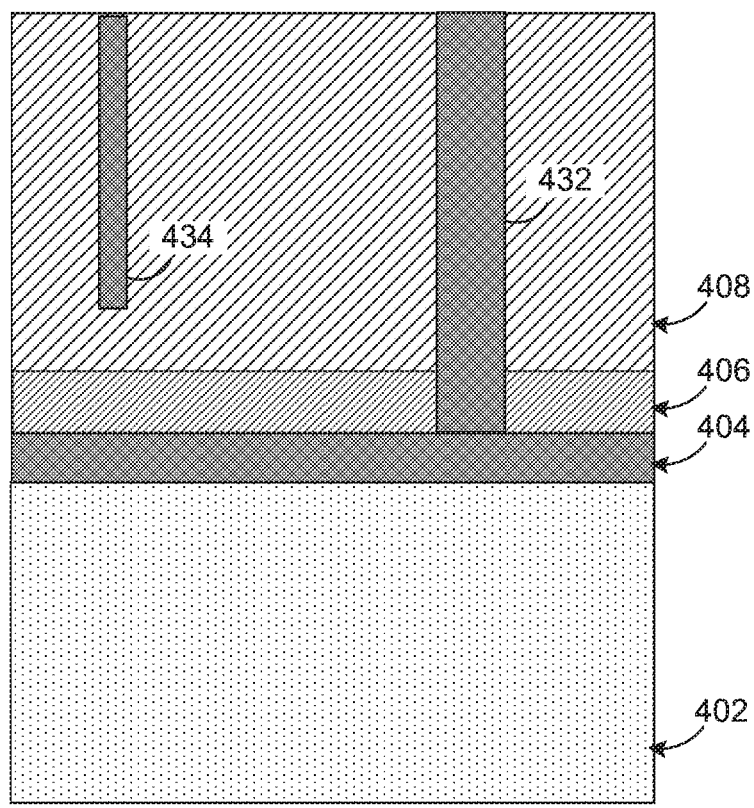
FIG. 13 is a structure illustrating an example of a second operation of the flowchart of FIG. 11.

Deep trench isolation structures and desired BVTs may then be formed together in a single step (1104), as shown in FIG. 13. For example, trenches may be formed using etching, and a trench depth may be controlled by etch rate modulation with trench width. Thus, forming one or more BVTs in conjunction with processes already requiring deep trench formation/isolation is straightforward, fast, and inexpensive.

Figure 14:
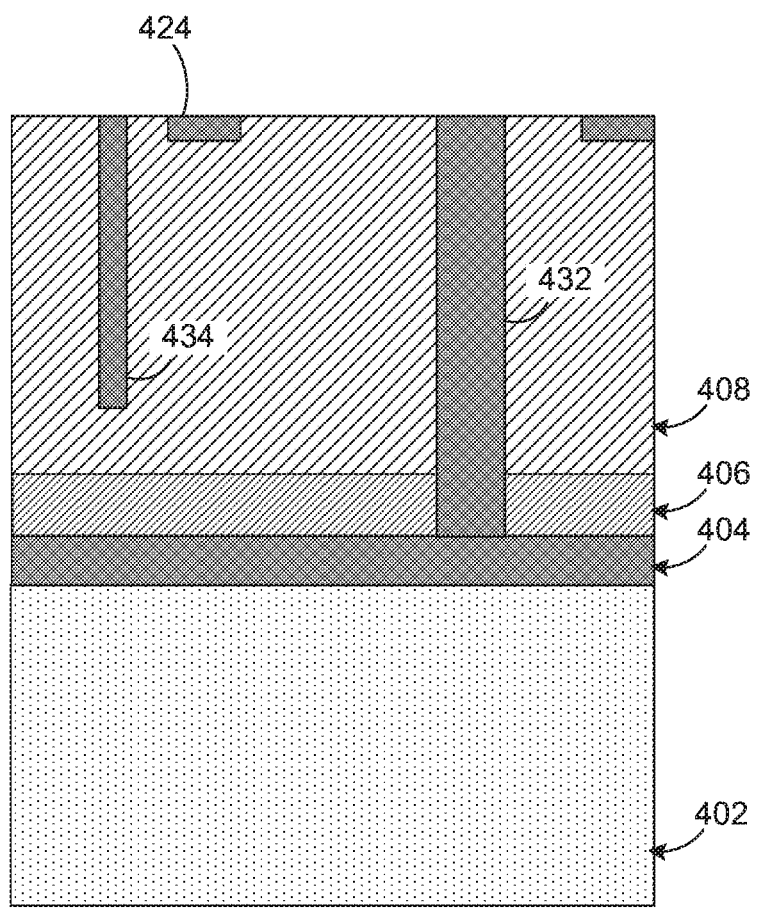
FIG. 14 is a structure illustrating an example of a third operation of the flowchart of FIG. 11.

Shallow trench isolation (STI) structures may then be formed (1106), as shown in FIG. 14. For example, in the example of FIG. 11, it is assumed that a CMOS (complementary metal oxide semiconductor) process is followed, and the STI structures may be formed as part of this process flow. In such contexts, STI structures are often formed, for example, to avoid leakage currents from undesired, parasitic BJTs that would otherwise be formed at PN junctions).

Figure 15:
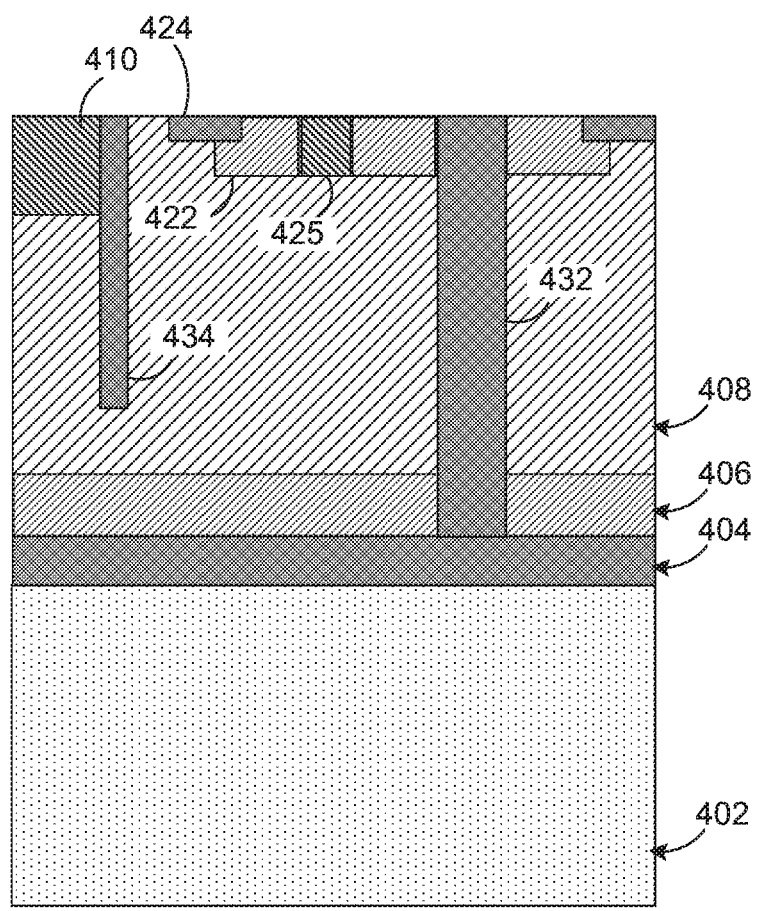
FIG. 15 is a structure illustrating an example of a fourth operation of the flowchart of FIG. 11.

Further in FIG. 11, the various wells may be implanted (1108), as shown in FIG. 15. For example, a combination of CMOS wells ($N_{wells}$ and $P_{wells}$) and medium voltage wells ($N_{resurf}$ and $P_{field}$) may be implanted. More generally, the techniques described herein may be used, for example, in implementations with CMOS wells only, as well as for any combination of CMOS wells and relatively higher voltage wells.

Figure 16:
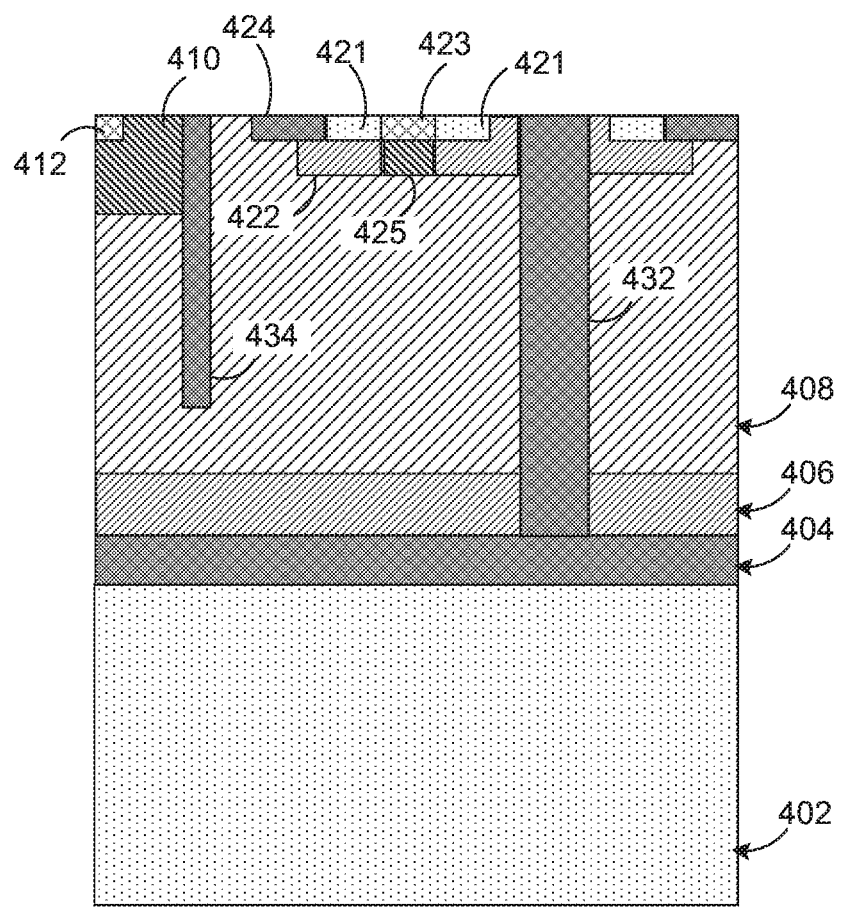
FIG. 16 is a structure illustrating an example of a fifth operation of the flowchart of FIG. 11.
Figure 17:
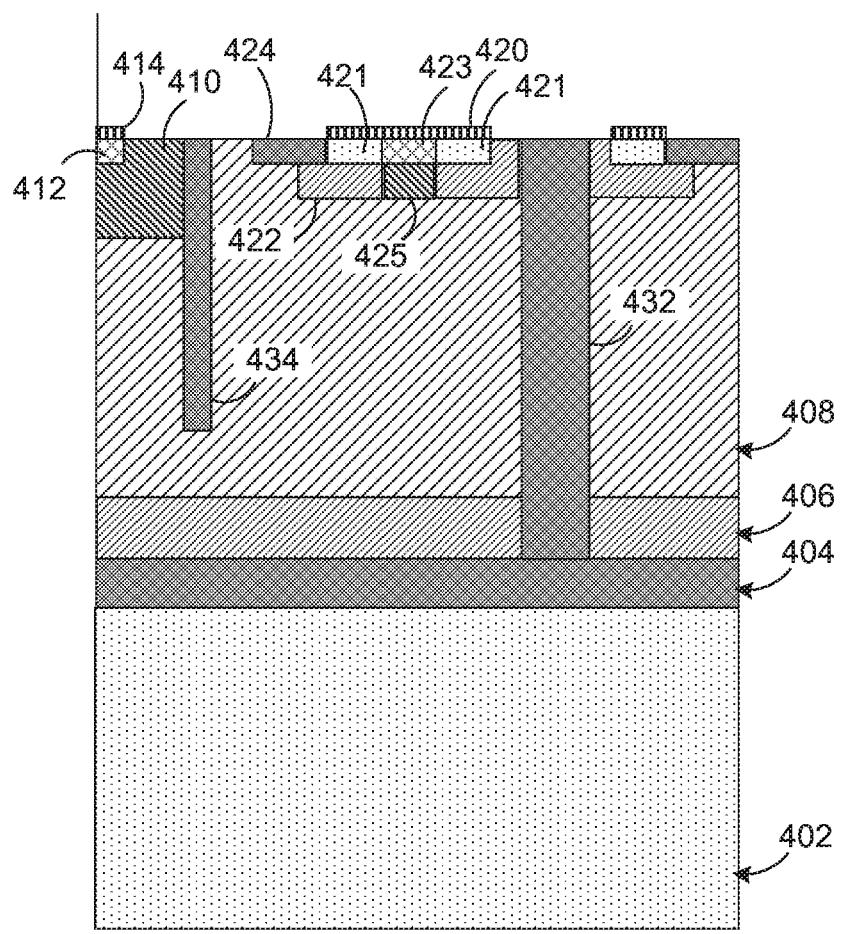
FIG. 17 is a structure illustrating an example of a sixth operation of the flowchart of FIG. 11.

Source and drain implants may then be formed, e.g., as part of the above-referenced CMOS flow, to form Ohmic contacts with the wells (1110), as shown in FIG. 16. Finally, modules may be formed to provide low resistive contacts (and to short the middle $N_{well}$ 425 in the anode 118), as shown in FIG. 17.

It will be appreciated that the various parameter values and ranges provided above are provided merely as examples, and are not limiting or exhaustive. For example, although not discussed in detail, above, in some examples a width of the vertical field plate may be in a range of 3-10 microns. A distance between a BVT and a DTI may be, e.g., in a range of 2-5 microns. A width of a BVT may be in a range of, e.g., 0.3-3 microns. An extension of a BVT beyond a bottom of a cathode region may be at least about 20% of a depth of the cathode region. Spacings between BVTs may be in a range of 2-5 microns. Moreover, when 3 or more BVTs are included, spacings between each consecutive pair of BVTs need not be equal.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
   a Silicon on Insulator (SOI) substrate;
   a diode formed on the SOI substrate, the diode including a cathode region and an anode region; and
   at least one breakdown voltage trench disposed at an edge of the cathode region, and between the cathode region and the anode region, the at least one breakdown voltage trench being non-conductive and including an insulating material.

2. The semiconductor device of claim 1, wherein the at least one breakdown voltage trench is adjacent to the cathode region, and extends beyond the cathode region in a direction of the insulator of the SOI substrate.

3. The semiconductor device of claim 2, wherein the at least one breakdown voltage trench extends in the direction of the insulator and leaves a current path through the SOI substrate between the cathode region and the anode region.

4. The semiconductor device of claim 1, wherein the at least one breakdown voltage trench includes at least two breakdown voltage trenches, including a first breakdown voltage trench at the edge of the cathode region, and a second breakdown voltage trench between the first breakdown voltage trench and the anode region.

5. The semiconductor device of claim 4, wherein the second breakdown voltage trench is adjacent to the anode region and extends beyond the anode region in a direction of the insulator of the SOI substrate.

6. The semiconductor device of claim 1, wherein the anode region includes a region of opposite doping type that is shorted to an anode of the diode, the anode acting as base of a lateral Bipolar Junction Transistor (BJT), with the region of opposite doping type acting as collector of the lateral BJT.

7. The semiconductor device of claim 1, wherein the at least one breakdown voltage trench includes an airgap formed therein.

8. The semiconductor device of claim 1, further comprising a vertical field plate disposed at an opposing edge of the cathode region as the breakdown voltage trench.

9. The semiconductor device of claim 8, wherein the vertical field plate is electrically connected to the cathode region.

10. The semiconductor device of claim 8, wherein the vertical field plate includes a first deep trench isolation structure adjacent to the cathode region that, together with a second deep trench isolation structure isolating the diode from at least one other circuit element formed in the SOI substrate, forms a pocket in which epitaxial material of the SOI substrate is maintained at a same potential as the cathode region.

11. A semiconductor device, comprising:
a substrate;
a diode formed in the substrate, the diode including a cathode region and an anode region;
at least one trench insulator adjacent to the cathode region that defines a diode current path around the at least one trench insulator that traverses the substrate between the cathode region and the anode region, the at least one trench insulator being non-conductive.

12. The semiconductor device of claim 11, wherein the substrate includes a Silicon on Insulator (SOI) substrate, and further wherein the at least one trench isolator extends beyond the cathode region in a direction of the insulator of the SOI substrate.

13. The semiconductor device of claim 11, wherein the diode current path is a reverse current occurring at a breakdown voltage of the diode.

14. The semiconductor device of claim 11, wherein the at least one trench insulator includes at least two trench insulators, including a first trench insulator at an edge of the cathode region, and a second trench insulator between the first trench insulator and the anode region.

15. The semiconductor device of claim 13, wherein the substrate includes a Silicon on Insulator (SOI) substrate, and further wherein the second trench insulator is adjacent to the anode region and extends beyond the anode region in a direction of the insulator of the SOI substrate.

16. The semiconductor device of claim 11, wherein the anode region includes a region of opposite doping type that is shorted to an anode of the diode, the anode acting as base of a lateral Bipolar Junction Transistor (BJT), with the region of opposite doping type acting as collector of the lateral BJT.

17. The semiconductor device of claim 11, further comprising a vertical field plate disposed at an edge of the cathode region opposed to an edge of the cathode region that is adjacent to the at least one trench insulator, the vertical field plate being electrically connected to the cathode region.

18. The semiconductor device of claim 11, further comprising a vertical field plate that includes a first deep trench isolation structure adjacent to the cathode region, which, together with a second deep trench isolation structure isolating the diode from at least one other circuit element formed in the SOI substrate, forms a pocket in which epitaxial material of the SOI substrate is maintained at a same potential as the cathode region.

19. A semiconductor device, comprising:
a substrate of a first conductivity type;
a diode formed in the substrate, the diode including a cathode region of a second conductivity type and an anode region including the first conductivity type;
at least one insulating trench adjacent to the cathode region that defines a reverse diode current path around the at least one trench insulator that traverses the substrate between the cathode region and the anode region.

20. The semiconductor device of claim 19, wherein the substrate is a Silicon on Insulator (SOI) substrate, and further wherein the at least one insulating trench is adjacent to the cathode region, and extends beyond the cathode region in a direction of the insulator of the SOI substrate.

* * * * *